United States Patent [19]

Kinugawa

[11] Patent Number: 5,665,645

[45] Date of Patent: Sep. 9, 1997

[54] METHOD OF MANUFACTURING A SEMICONDUCTOR DEVICE USING RETICLES

[75] Inventor: Masaaki Kinugawa, Tokyo, Japan

[73] Assignee: Kabushiki Kaisha Toshiba, Tokyo, Japan

[21] Appl. No.: 668,522

[22] Filed: Jun. 28, 1996

Related U.S. Application Data

[63] Continuation of Ser. No. 86,509, Jul. 1, 1993, abandoned.

[30] Foreign Application Priority Data

Jul. 2, 1992 [JP] Japan .................................. 4-175515

[51] Int. Cl.⁶ .................................................. H01L 21/28
[52] U.S. Cl. ........................................ 438/637; 438/975
[58] Field of Search ................................ 437/195, 924, 437/193, 200; 257/797

[56] References Cited

U.S. PATENT DOCUMENTS

| | | | |
|---|---|---|---|
| 4,992,394 | 2/1991 | Kostelak, Jr. et al. | 437/924 |
| 5,250,468 | 10/1993 | Matsuura et al. | 437/195 |
| 5,468,664 | 11/1995 | Kajita | 437/924 |

FOREIGN PATENT DOCUMENTS 62-024260  2/1987  Japan.

OTHER PUBLICATIONS

S. Wolf "Silicon Processing For the VLSI Era, vol. 2.", Lattice Press, 1990, p. 176.

*Primary Examiner*—John Niebling
*Assistant Examiner*—Thomas G. Bilodeau
*Attorney, Agent, or Firm*—Loeb & Loeb LLP

[57] ABSTRACT

A first insulating film is formed on the surface of a silicon substrate, and a first silicide wiring layer is deposited on the insulating film. A first mark is formed by transferring the pattern of a first reticle formed on the silicide wiring layer. A second insulation film is deposited on the mark and the first insulation film, and a second mark is formed on the first mark by transferring the pattern of a second reticle formed on the second insulation film. A second silicide wiring layer is deposited in the second mark and on the second insulating film. An anti dust deposit and a third mark are formed by transferring the pattern of a third reticle formed on the second silicide wiring layer. Thus, dusts from the marks produced by transferring the reticle inspection marks of the reticles can be effectively prevented to improve the yield of LSIs.

3 Claims, 5 Drawing Sheets

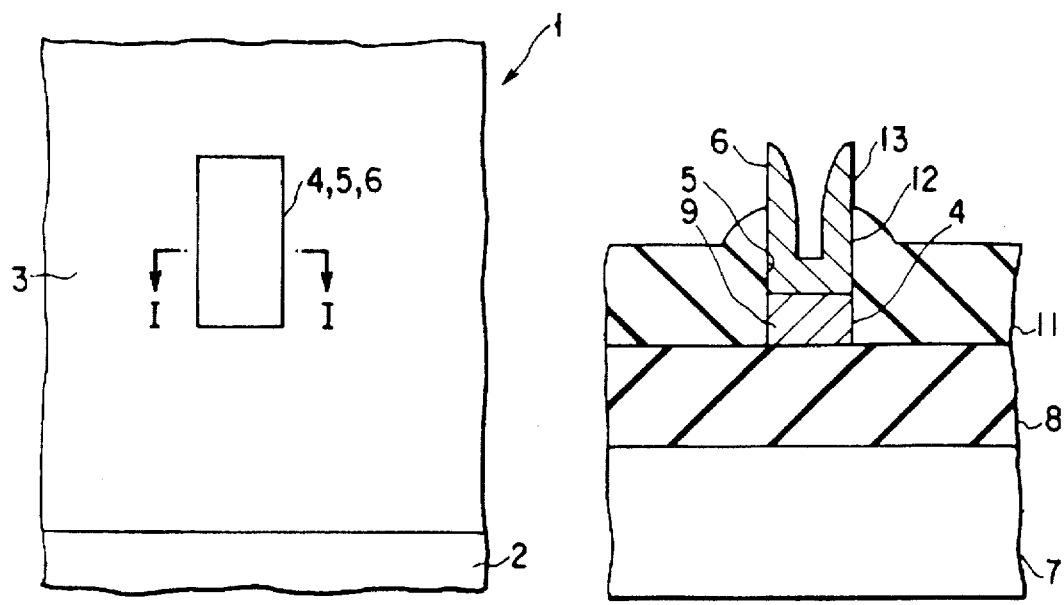
PRIOR ART
FIG. 3
PRIOR ART
FIG. 4
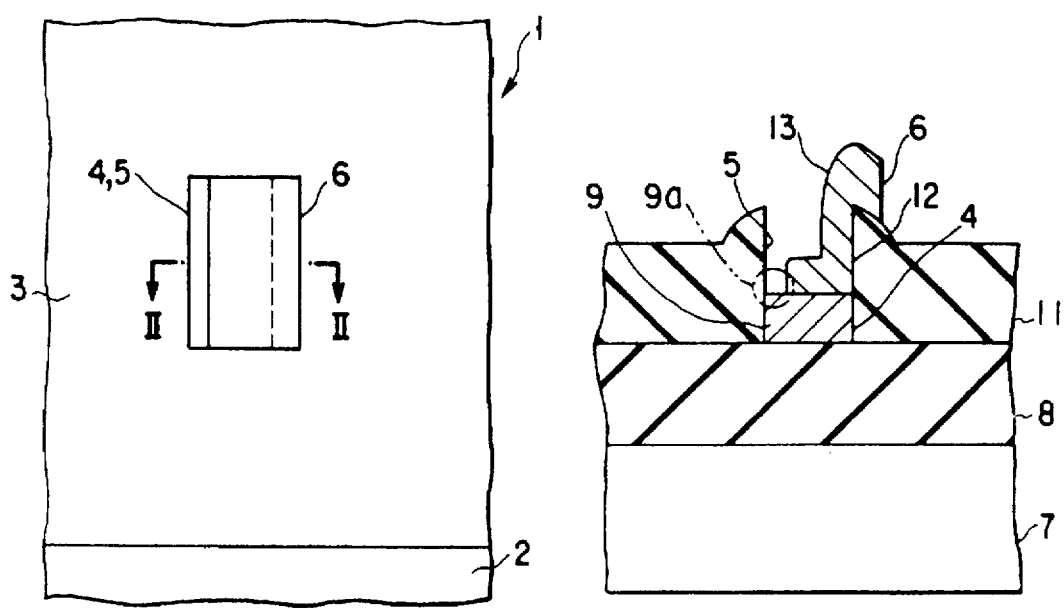
PRIOR ART
FIG. 5
PRIOR ART
FIG. 6

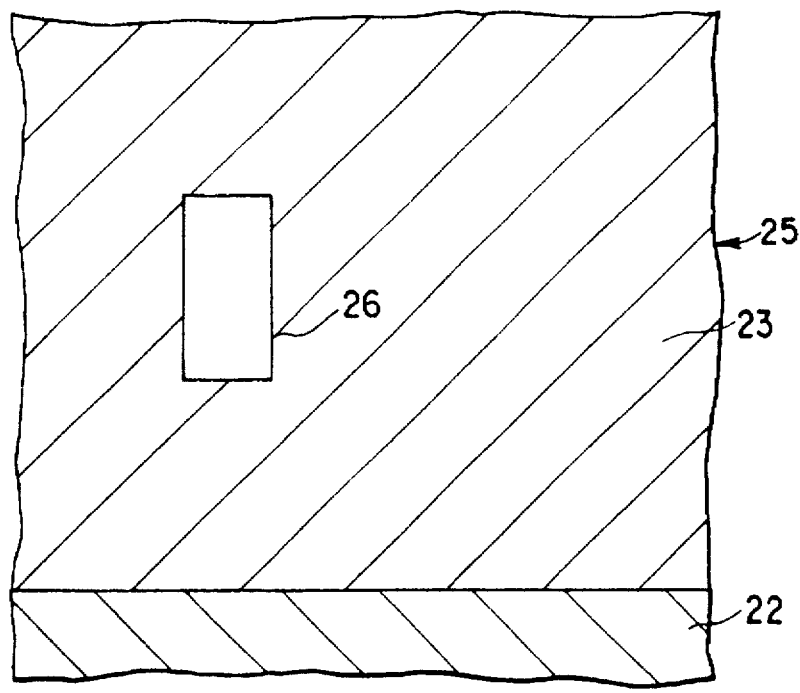
F I G. 10
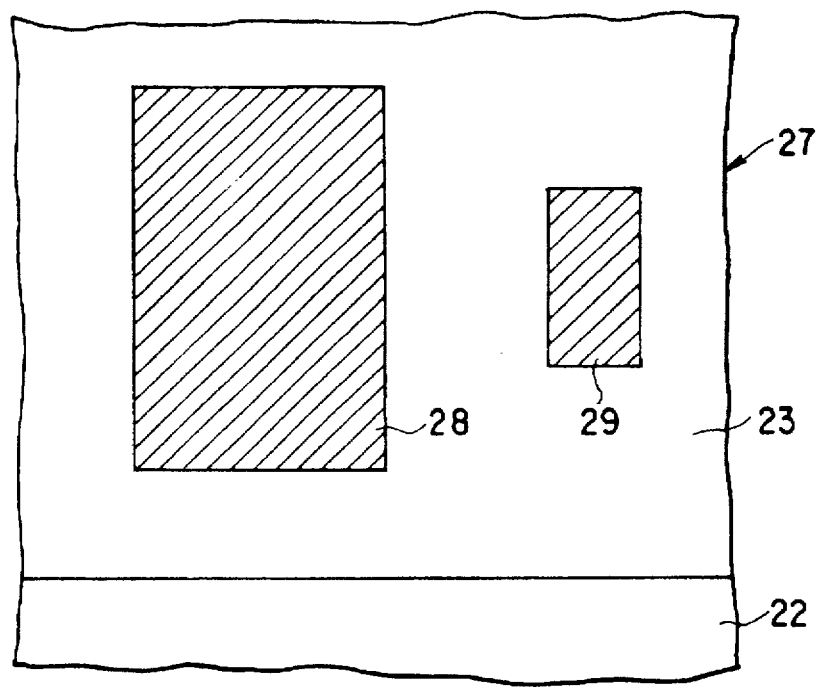
F I G. 11

METHOD OF MANUFACTURING A SEMICONDUCTOR DEVICE USING RETICLES

This is a continuation of application Ser. No. 08/086,509, filed Jul. 1, 1993, now abandoned.

BACKGROUND OF THE INVENTION

1. Field of the Invention

The present invention relates to reticles (photo masks), a semiconductor device manufactured by using the reticles, and a method of manufacturing the same.

2. Description of the Related Art

FIG. 1 is a schematic perspective view illustrating a process of transferring a pattern of a reticle (photo mask) to a semiconductor chip. Tens of reticles 50, each carrying a particular pattern 62 having a size N times, e.g., 5 times, larger than that of the pattern formed on the chip 2, are prepared in advance according to each of required patterns for a semiconductor device. The pattern 62 of the reticle 50 is sequentially transferred to the chips 2 by means of an optical 1/N reduction projection technique. Defect-free reticles 50 are needed since the defects of the reticles 50 are transferred to all the semiconductor chips 2 if the reticles 50 have defects. It is required that each reticle be aligned with high precision to prevent a misalignment of the mask since tens of reticles have to be used. A resist layer is coated on the wafer 1. The resist is molten only in those areas where it is irradiated by the light to produce a pattern. After the processes are completed, the chips 2 are cut on the scribe lines 3. Reference numeral 55 in FIG. 1 denotes a reduction optical system.

FIG. 2 is an enlarged plan view of a reticle. Usually, a reticle 50 comprises a transparent glass substrate 61 and a pattern-forming film 62 made of a metal such as chromium. The glass substrate 61 has on its surface the pattern-forming film 62 used for forming semiconductor elements and a reticle inspection mark (QC mark) 64 used for ensuring the dimensional accuracy of the mask and determining the quality of the reticle. The inspection mark 64 is located in a scribe line-forming area 63 on the surface of the glass substrate 61, which corresponds to the scribe line 3 of a wafer 1. A vernier 65 used for achieving an accurate alignment of the reticle 50 is provided in the scribe line-forming area 63. Reference numeral 66 in FIG. 1 denotes the chip-forming area of the reticle 50.

FIG. 3 is a plan view of a conventional wafer 1. A plurality of semiconductor chips 2 are formed on the wafer 1. First, second and third marks 4, 5, and 6 are formed at given locations on scribe lines 3 separating the chips 2, by using first, second and third reticles. In other words, the marks 4, 5, and 6 are produced there by transferring the inspection marks 64 each formed on the first, second and third reticles. A large number of QC (quality control) marks, such as dimensional reference marks and aligning marks, need to be formed on the scribe lines 3. Since the first, second and third marks 4, 5, and 6 must be required to occupy a minimum surface area, they are formed on the same area, overlapping one another.

FIG. 4 is a sectional view of the wafer 1 taken along a I—I line in FIG. 3. A silicon substrate 7 has a first insulation film 8 formed on its surface. A first silicide wiring layer 9 is deposited on the first insulation film 8. The layer 9 is in an amorphous state. The layer 9 is subjected to patterning by means of a lithography technique using the first reticle, thereby forming a first mark 4. Then, the first silicide wiring layer 9, which is still in an amorphous state, is annealed, turning into a polycrystalline state which has a reduced resistance. Simultaneously, the first mark 4 is also rendered polycrystalline. Next, a second insulation film 11 is formed on the first mark 4 and the first insulation film 8. Then, the second mark 5, that is, an opening 12 which is located on the first mark 4, is formed in the second insulation film 11 by the lithography technique using the second reticle. The sides of the opening 12 are aligned with the sides of the first mark 4. Thereafter, a second silicide wiring layer 13 is deposited on the second insulation film 11, filling the opening 12. The layer 13 is subjected to patterning by means of the lithography technique using the third reticle whereby the third mark 6 is formed in and on the opening 12. The sides of the third mark 6 are aligned with the sides of the opening 12. In other words, if the first mark 4 (first silicide wiring layer 9), the second mark 5 (opening 12), and the third mark 6 (second silicide wiring layer 13) are aligned with one another, the patterns produced by the reticles will be aligned accurately on the silicon substrate 7.

As described above, the first silicide wiring layer 9 is formed on the semiconductor chip 2 by the lithography technique using the first reticle, and the second insulation film 11 is deposited on the first silicide wiring layer 9. Then, a contact hole (not shown) is formed in the second insulation film 11 by means of the lithography technique using the second reticle. The size of the contact hole includes an alignment margin to allow for a possible misalignment of the reticles. The second silicide wiring layer 13 is deposited on the second insulation film 11 and in the contact hole and then is formed as the second silicide wiring by the lithography technique using the third reticle. The second silicide wiring is also large enough to allow for a possible misalignment of the third reticle.

FIGS. 5 and 6 are respectively a plan view and a sectional view illustrating the misalignment of the marks 4, 5 and 6 caused by the misalignment of the reticles. As shown in FIG. 5, if the third reticle is misaligned within the alignment margin, the third mark 6 which is formed on the scribe line 3 between the adjacent chips 2 is displaced with respect to the first and second marks 4 and 5. If the third mark 6 is so displaced, a part 9a of the first silicide wiring layer 9, already in a polycrystalline state, will be over-etched, as illustrated in FIG. 6, when the second silicide wiring layer 13 is etched using the third reticle. Since the polycrystalline silicide wiring layer 9 is etched at different rates inside the grain and on the grain boundary and depending on the face orientation of the grain, grains may be scraped and separated from the silicide wiring layer 9 as the etching proceeds along the grain boundaries. The grains, thus scraped, make dust which reduces the yield of semiconductor chips, i.e., LSIs.

FIG. 7 is a sectional view illustrating a vernier 49 formed on a scribe line 3 of a conventional wafer 1. The vernier 49 is formed by transferring the vernier 65 formed on a scribe line-forming area 63 of the reticle 50 on the wafer 1. The principal calibration 4a of the vernier 49 is formed in a pattern at the same time when the first silicide wiring layer 9, i.e., the first mark 4 is formed. The auxiliary calibration (the opening) 5a of the vernier 49 is formed in another pattern simultaneously when the opening 12 is formed for the second mark 5. The vernier 49, thus formed, can serve to determine the precision of alignment of the patterns transferred on the wafer 1. However, some of the grains of the silicide serving as the principal calibration 4a of the vernier 49 may also be scraped during the etching process using the third reticle, thus producing dust which will reduce the yield of LSIs.

SUMMARY OF THE INVENTION

In view of the above described circumstances, it is an object of the present invention to provide reticles, a semiconductor device manufactured by using reticles and a method of manufacturing the semiconductor device, in which dust is effectively prevented from being produced from the marks deposited on a wafer and as transferred copies of the reticles even if the reticles are misaligned, and in which LSIs can be manufactured at high yield.

According to an aspect of the present invention, there is provided a reticle comprising: a glass substrate; a first pattern-forming layer formed on the glass substrate, having a shape larger than that of an opening-forming inspection mark formed on another reticle, used for forming an opening of a first predetermined shape on a wafer, and located covering the opening-forming inspection mark; and a reticle inspection mark of the first predetermined shape formed on the surface of the glass substrate and located at a position remote from the first pattern-forming layer.

According to another aspect of the present invention, there is provided reticles comprising at least: a first reticle including a first glass substrate, and a first reticle inspection mark made of metal, formed on the first glass substrate and having a first predetermined shape and size; a second reticle including a second glass substrate, and a second reticle inspection mark formed on the second glass substrate and having the first predetermined shape and size for forming an opening of the first predetermined shape on a wafer; and a third reticle including a third glass substrate, a first pattern-forming layer formed on the third glass substrate, having a shape larger than that of the second reticle inspection mark formed on the second reticle and located covering the second reticle inspection mark, and a third reticle inspection mark formed on the third reticle inspection mark formed on the third glass substrate, having the first predetermined shape and size, and located at a position remote from the first pattern-forming layer.

According to still another aspect of the present invention, there is provided a semiconductor device comprising: a first insulating film; a first mark formed by etching a first metal layer deposited on the first insulating film using a first reticle; an opening serving as a second mark located above the first mark, the opening having been formed by etching the first insulating film and a second insulating film deposited on the first mark using a second reticle; a deposit formed by etching a second metal layer deposited in the opening and on the second insulating film using a third reticle, and completely covering the first mark deposited in the opening; and a third mark formed at a position remote form the deposit.

According to still another aspect of the present invention, there is provided a method of manufacturing a semiconductor device, comprising the steps of: depositing a first metal layer on a first insulating film; forming a first mark by etching the first metal layer using a first reticle; depositing a second insulating film on the first insulating film and the first mark; forming an opening, above the first mark, as a second mark by etching the second insulating film using a second reticle; depositing a second metal layer in the opening and on the second insulating film; and forming a third mark by etching the second metal layer using a third reticle, thereby to form a deposit completely covering the first mark located in the opening, the third mark being located at a position remote from the deposit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a plan view showing a conventional wafer;

FIG. 4 is a sectional view of the wafer taken along a line I—I in FIG. 3;

FIG. 5 is a plan view showing a conventional wafer having misaligned marks thereon caused by the misalignment of the reticles;

FIG. 6 is a sectional view of the wafer taken along a line II—II in FIG. 5;

FIG. 10 is a plan view showing a second reticle used in an embodiment of the present invention;

FIG. 11 is a plan view showing a third reticle used in an embodiment of the present invention;

DETAILED DESCRIPTION OF THE PREFERRED EMBODIMENT

Preferred embodiments of the present invention will be described in detail with reference to the accompanying drawings.

Figure 1:
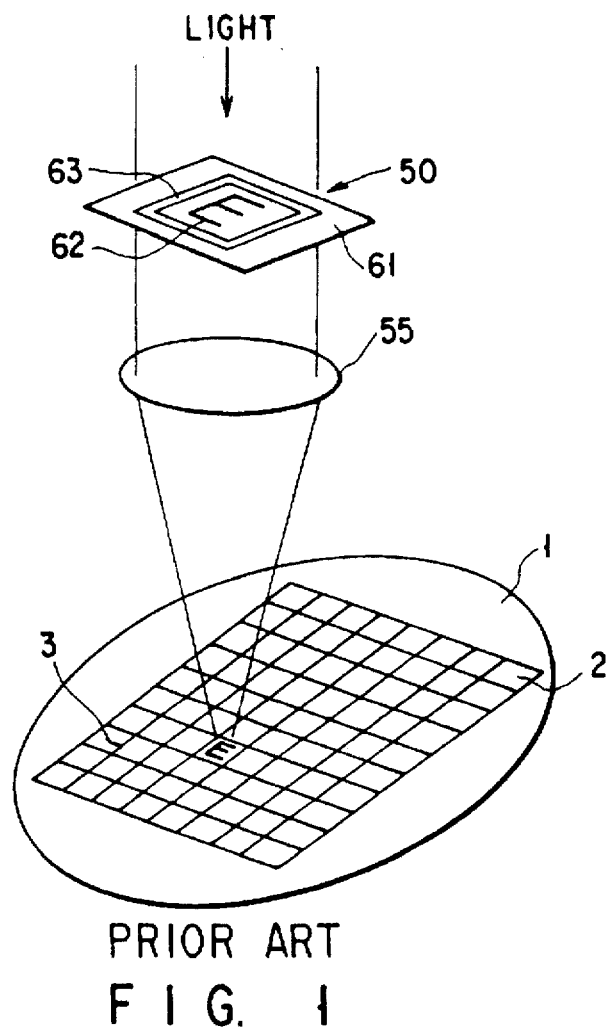
FIG. 1 is a perspective view explaining a process of transferring a pattern of a reticle to a semiconductor chip.
Figure 2:
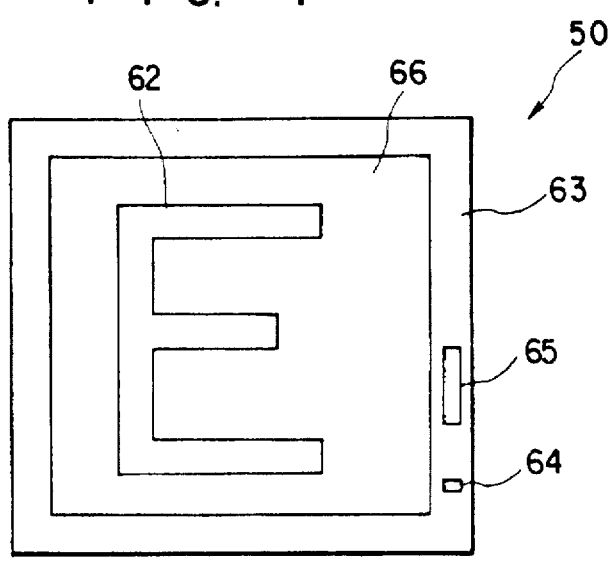
FIG. 2 is a plan view showing a reticle.
Figure 7:
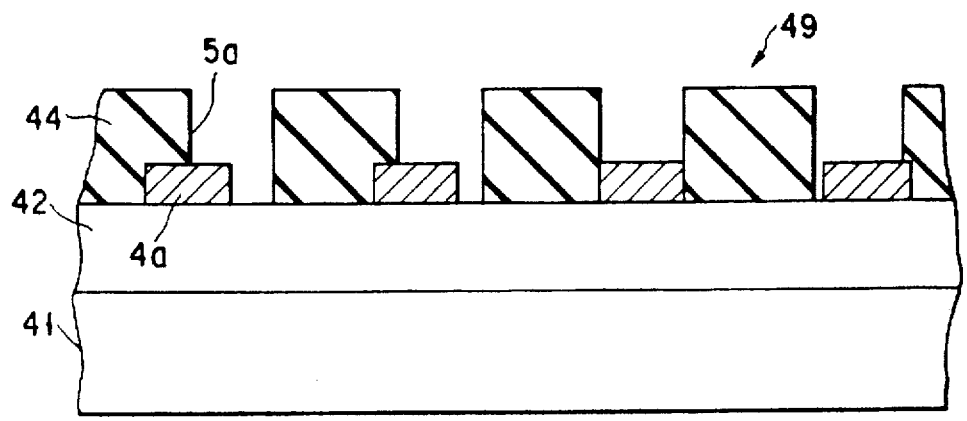
FIG. 7 is a sectional view showing a conventional wafer having a vernier formed thereon.
Figure 8:
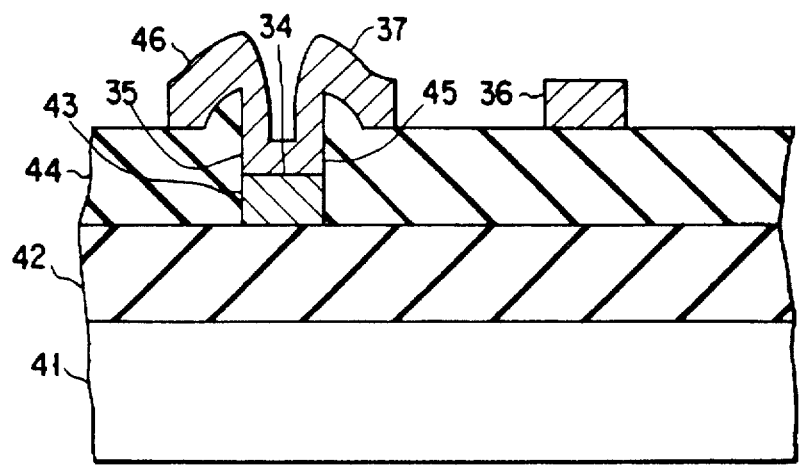
FIG. 8 is a partial sectional view of a wafer having marks formed thereon according to an embodiment of the present invention.
Figure 9:
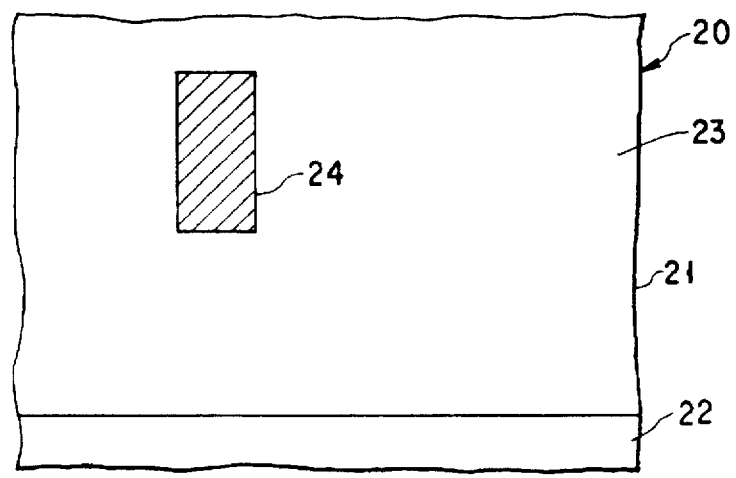
FIG. 9 is a plan view showing a first reticle used in an embodiment of the present invention.
Figure 12:
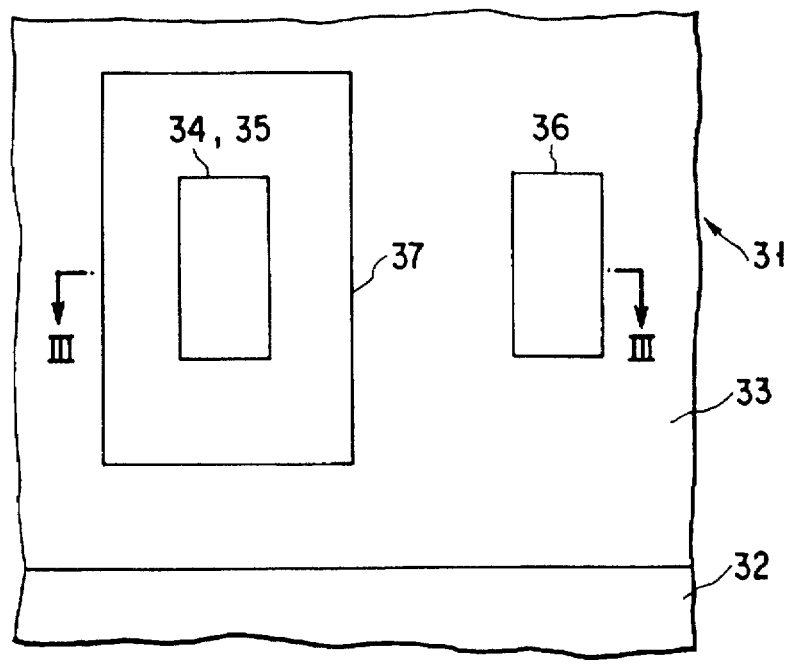
FIG. 12 is a plan view showing reference marks on a wafer according to an embodiment of the present invention.

FIG. 8 is a partial sectional view of a wafer, taken along a line III—III in FIG. 12, having the inspection marks formed thereon according to an embodiment of the present invention. A first insulating film 42 is formed on the surface of a silicon substrate 41. A first silicide wiring layer 43 is deposited on the first insulating film 42. The wiring layer 43 is in an amorphous state. A first mark 34 is formed on the first silicide wiring layer 43 by a patterning process using the lithography technique and a first reticle 20, as shown in FIG. 9, as a transferred copy of the first reticle inspection mark 24 formed on a first reticle 20. Thereafter, the first silicide wiring layer 43 is annealed to be changed from an amorphous state to a polycrystalline state. The electric resistance of the first silicide wiring layer 43 is thereby reduced. The first mark 34 is also rendered polycrystalline at this time. Then, a second insulating film 44 is deposited on the silicide wiring layer 43 and said first insulation film 42. The insulating film 44 is patterned by means of the lithography technique using a second reticle 25, as shown in FIG. 10. A second mark 35, which is an opening 45 located on the first mark 34, is thereby formed in the first mark 34 as a transferred copy of a second reticle inspection mark 26 formed on the second reticle 25. Next, a second silicide wiring layer 46 is deposited in the opening 45 and on the second insulating film 44. The second wiring layer 46 is patterned by means of the lithography technique using a third reticle 27, as illustrated in FIG. 11. Consequently, an anti-dust deposit 37 and a third mark 36 are formed on the wafer, respectively, as transferred copies of an anti-dust pattern-forming film 28 and a third reticle inspection mark 29 both formed on the third reticle 27. The anti-dust deposit 37 sufficiently covers the first mark 34 so that the first mark 34 may not be exposed by the opening 45. The third mark 36 is formed at a position remote from the anti-dust deposit 37 on the same silicon substrate 41.

FIG. 9 is a plan view of a first reticle 20 used in an embodiment of the present invention, after the formation of a first silicide wiring layer 43. The first reticle 20 comprises a region 22 for forming a semiconductor chip and a region 23 for forming a scribe line, both arranged on a glass substrate 21. A pattern forming film (not shown) made of metal such as chromium is arranged on the region 22, for forming a semiconductor chip. A rectangular first reticle inspection mark 24 also made of metal such as chromium is arranged on the region 23 for forming a scribe line. The shorter sides or the horizontal sides in FIG. 9 of the first reticle inspection mark 24 are prepared with highly precise lengths because they define the resolution limit of the reticle inspection mark. The length of each horizontal side of the inspection mark 24 may be 5.0 µm±0.5 µm, for example. Thus, the quality of the pattern-forming film of the first reticle 20 may be determined by checking the dimension and shape of the first reticle inspection mark 24.

FIG. 10 is a plan view of a second reticle 25 used in an embodiment of the present invention. Those components of this reticle which are similar to those of the reticle of FIG. 9 are respectively denoted by the same reference numerals. Only the components that are different from the corresponding ones shown in FIG. 9 will be described in detail. The second reticle 25 is used after the formation of a second insulation film 44, forming a contact hole in the second insulation film 44. A second reticle inspection mark 26 is formed in a scribe line-forming region 23 at a position corresponding to that of the first reticle inspection mark 24 of the first reticle 20. A pattern-forming film made of chromium is disposed in the area surrounding the second reticle inspection mark 26, or the shaded area in FIG. 10. Like the first reticle inspection mark 24 of the first reticle 20, the second reticle inspection mark 26 is also used to determine the quality of the pattern forming film of the second reticle 25.

FIG. 11 is a plan view of a third reticle 27 used in an embodiment of the present invention. Those components of the third reticle 27 which are similar to those of the reticle of FIG. 9 are denoted by the same reference numerals. Only the components that are different from the corresponding ones shown in FIG. 9 will be described in detail. The third reticle 27 is used after the formation of a second silicide wiring layer 46. An anti-dust pattern-forming film 28 and a third reticle inspection mark 29 are arranged in a scribe line-forming region 23. The anti-dust pattern-forming film 28, which is rectangular, is disposed at a position corresponding to the second reticle inspection mark 26 of the second reticle 25 and has a size that completely covers the surface of the second reticle inspection mark 26 when the third reticle 27 and the second reticle 25 overlap each other. The third reticle inspection mark 29 is disposed at a position remote from the anti-dust pattern-forming film 28. The third reticle inspection mark 29 is arranged there to provide a minimum dimensional reference, which are not defined by the anti-dust pattern-forming film 28. The dimension and shape of the third reticle inspection mark 29 is also used to determine the quality of the pattern-forming film of the third reticle 27.

FIG. 12 is a plan view showing reference marks 34, 35 and 36 on the wafer 31. A plurality of semiconductor chips 32 are formed on the surface of the wafer 31. First, second and third marks 34, 35 and 36 as well as an anti-dust deposit 37 are formed on the scribe line 33 separating adjacent semiconductor chips 32. The marks 34, 35 and 36 and the deposit 37 are respectively transfer copies of the first, second and third reticle inspection marks 24, 26 and 29 and the anti-dust pattern-forming film 28 of the first, second and third reticles 20, 25 and 27 which have been described with reference to FIGS. 9 to 11. The marks 34, 35 and 36 and the deposit 37 are reduced by a predetermined reduction scale. The pattern-forming films on the respective first, second and third reticles 20, 25 and 27 are five times as large as the patterns formed on the wafer 31, for example. In short, all the patterns on the wafer 31 are reduced transfer copies of the patterns formed on the first, second and third reticles 20, 25 and 27.

With the above described embodiment, the size of the pattern-forming film 28 formed on the third reticle 27 for forming an anti-dust deposit 37 is much larger than the second reticle inspection mark 26 formed on the second reticle 25 for forming an opening 45. Thus, even if the third reticle 27 is slightly misaligned during the lithography process when the second silicide wiring layer 46 is patterned by using the third reticle 27, the polycrystalline first mark 34 which is exposed through the opening 45 is completely covered by the anti-dust deposit 37. As a result, the first mark 34 is not over-etched and therefore dust will not be produced. Thus, the yield of manufacturing LSIs will be improved by the present invention.

Figure 13:
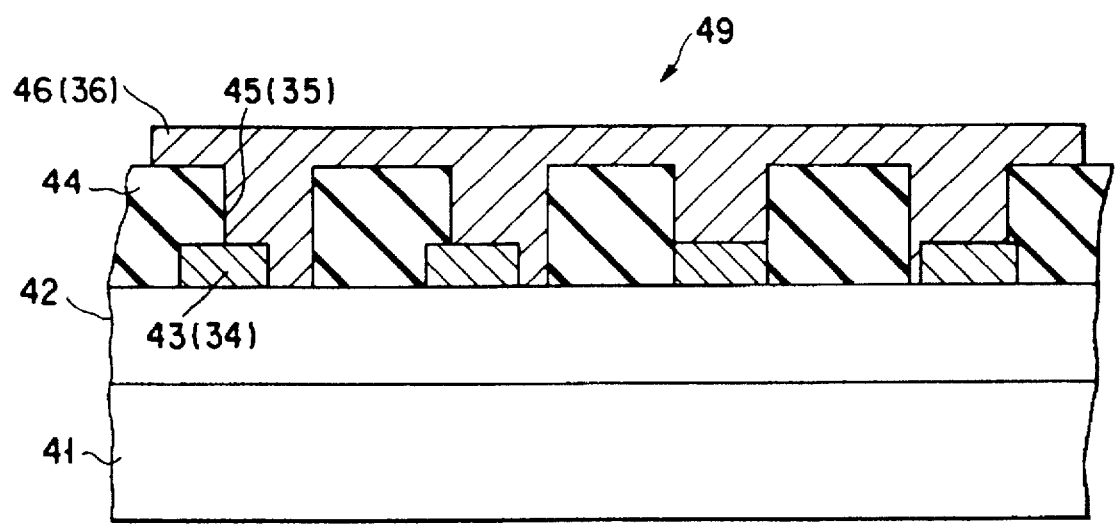
FIG. 13 is a sectional view showing a vernier formed on a wafer according to an embodiment of the present invention.

FIG. 13 is a sectional view showing a vernier 49 formed on a wafer according to an embodiment of the present invention. As shown in FIG. 13, a first insulating film 42 is formed on the surface of the silicon substrate 41. A first silicide wiring layer 43 having a given pattern is formed on the first insulating film 42. A number of silicide wiring layers 43 (first marks 34) are arranged on the film 42 by using the first reticle 20, spaced apart by a predetermined distance. A second insulating film 44 is formed on the first insulation film 42 and the first silicide wiring layer 43. Openings 45 (second marks 35) are formed by using the second reticle 25. The first marks 34 constitute the principal calibration of the vernier 49 whereas the second marks 35 form the auxiliary calibration thereof. The pitch of the principal calibration is slightly different from that of the auxiliary calibration so that the vernier 49 can serve to determine the degree of alignments of the reticles. A second silicide wiring layer 46 is formed, covering the openings 45 to prevent dust from being produced from the first silicide wiring layer 43 by over-etching.

In the above embodiments, the reticle inspection marks 24, 26 and 29 are formed on the transparent glass substrates 21 of the reticles 20, 25 and 27, respectively. Alternatively, use may be made of reticles, each comprising a transparent glass substrate and a QC mark such as a dimensional reference mark, an alignment mark formed on the glass substrate. Further, the two layered silicide wiring layers formed in the semiconductor device described above may be replaced by three or more layered silicide wiring layers. Still further, the first silicide wiring layer 43 deposited on a first insulation film 42 by deposition and the silicide wiring layer 46 deposited in an opening 45 and on a second insulation film 44 may be replaced by a first polycide wiring layer and a second polycide wiring layer, respectively. Moreover, the first, second and third marks 34, 35 and 36 may have any shape other than a rectangular one.

As described above, since a pattern-forming film formed on the third reticle has an area larger than that of a first reticle inspection mark formed on the second reticle, dust may be prevented from being produced from any transfer copied mark formed on the wafer made by transferring the reticle inspection mark even if the reticles are displaced from one another. Hence, the reticles according to the present invention help to manufacture LSIs at high yield.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, the method comprising the steps of:
    depositing a first metal layer on a first insulating film on a wafer,
    forming a first mark on a scribe line of said wafer by photolithographically patterning and etching said first metal layer using a first reticle;
    depositing a second insulating film on said first insulating film and said first mark;
    forming an opening, above said first mark, as a second mark by photolithographically patterning and etching said second insulating film using a second reticle;
    depositing a second metal layer in said opening and on said second insulating film;
    forming a deposit completely covering said first mark located in said opening by photolithographically patterning and etching said second metal layer using a third reticle, said deposit also covering a portion of said second insulating film completely surrounding said opening; and
    forming a third mark on said scribe line of said wafer at a position remote from said deposit by photolithographically patterning and etching said second metal layer using said third reticle.

2. The method of claim 1 wherein said third mark has a rectangular shape.

3. The method of claim 1 wherein said first and second metal layers each include at least one constituent selected from the group of silicide and polycide.

* * * * *